(12) United States Patent
Yoshizawa et al.

(10) Patent No.: US 11,418,219 B2
(45) Date of Patent: Aug. 16, 2022

(54) LEARNING DEVICE

(71) Applicant: KIOXIA CORPORATION, Tokyo (JP)

(72) Inventors: Ryota Yoshizawa, Yokohama Kanagawa (JP); Kenichiro Furuta, Shinjuku Tokyo (JP); Yuma Yoshinaga, Yokohama Kanagawa (JP); Osamu Torii, Minato Tokyo (JP); Tomoya Kodama, Kawasaki Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 26 days.

(21) Appl. No.: 17/005,270

(22) Filed: Aug. 27, 2020

(65) Prior Publication Data
US 2021/0242888 A1 Aug. 5, 2021

(30) Foreign Application Priority Data
Jan. 30, 2020 (JP) .............................. JP2020-014085

(51) Int. Cl.
*H03M 13/29* (2006.01)
*G06N 3/08* (2006.01)
*H03M 13/45* (2006.01)

(52) U.S. Cl.
CPC .......... *H03M 13/2927* (2013.01); *G06N 3/08* (2013.01); *H03M 13/451* (2013.01)

(58) Field of Classification Search
CPC ........... H03M 13/2927; H03M 13/451; H03M 13/1102; H03M 13/6597; H03M 13/1191; G06N 3/08
See application file for complete search history.

(56) References Cited

U.S. PATENT DOCUMENTS

| 5,796,611 A | 8/1998 | Ochiai et al. |
| 10,382,067 B2 | 8/2019 | Sharon et al. |
| 2018/0322391 A1* | 11/2018 | Wu .................. G06N 3/084 |
| 2018/0357530 A1 | 12/2018 | Beery et al. |

(Continued)

FOREIGN PATENT DOCUMENTS

JP H04-64132 A 2/1992

OTHER PUBLICATIONS

Nachmani et al. "Deep Learning Methods for Improved Decoding of Linear Codes," Accepted to IEEE Journal of Selected Topics in Signal Processing, arXiv: 1706.07043v2 [cs.IT], Jan. 1, 2018, 13 pages.

*Primary Examiner* — Thien Nguyen
(74) *Attorney, Agent, or Firm* — Kim & Stewart LLP

(57) ABSTRACT

According to one embodiment, a learning device includes a noise generation unit, a decoding unit, a generation unit, and a learning unit. The noise generation unit outputs a second code word which corresponds to a first code word to which noise has been added. The decoding unit decodes the second code word and outputs a third code word. The generation unit generates learning data for learning a weight in message passing decoding in which the weight and a message to be transmitted are multiplied, based on whether or not decoding of the second code word into the third code word has been successful. The learning unit determines a value for the weight in the message passing decoding by using the learning data.

18 Claims, 12 Drawing Sheets

(56) References Cited

U.S. PATENT DOCUMENTS

2018/0358988 A1* 12/2018 Sharon ................ H03M 13/255
2020/0177418 A1* 6/2020 Hoydis ............. H04L 25/03834
2021/0142158 A1* 5/2021 Agrawal ............ H03M 13/1191

* cited by examiner

LEARNING DEVICE

CROSS-REFERENCE TO RELATED APPLICATION(S)

This application is based upon and claims the benefit of priority from Japanese Patent Application No. 2020-014085, filed Jan. 30, 2020, the entire contents of which are incorporated herein by reference.

FIELD

Embodiments described herein relate generally to a learning device.

BACKGROUND

As one decoding method of an error correction code (ECC), belief-propagation (BP) on a Tanner graph ("BP method") is known. Belief-propagation (BP) on a Tanner graph can be equivalently expressed as a neural network. A technique (Weighted-BP) has been proposed in which the neural network is used to further improve performance of the BP method by learning a weight to be applied to a message propagating through the BP.

In the related art, ECC data with noise, for which decoding is impossible, can sometimes be used as a learning target, but this may hinder learning in some cases.

DETAILED DESCRIPTION

Embodiments provide a learning device which can more efficiently perform learning of a weight to be used in Weighted-BP method.

In general, according to one embodiment, a learning device includes a noise generation unit, a decoding unit, a generation unit, and a learning unit. The noise generation unit receives a first code word and outputs a second code word, which is the first code word but with added noise. The decoding unit decodes the second code word and outputs a third code word as the decoding result. The generation unit generates learning data based on the third code word for learning a weight in message passing decoding for which the weight a transmitted message is multiplied by the weight. The learning unit determines (learns) a value for the weight for the message passing decoding by using the learning data.

Hereinafter, a learning device according to certain example embodiments will be described with reference to the accompanying drawings. The present disclosure is not limited to the example embodiments described below.

In one example, a learning device which provides the weight (s) for a Weighted-BP method will be described. An applicable decoding method is not limited to Weighted-BP, and may be another message passing decoding in which a weight is multiplied with a message to be transmitted. An example of learning the weight of a neural network representing a decoding process will be described. A model other than a neural network may be used, and a weight may be learned using a learning method applicable to such a model.

Figure 1:
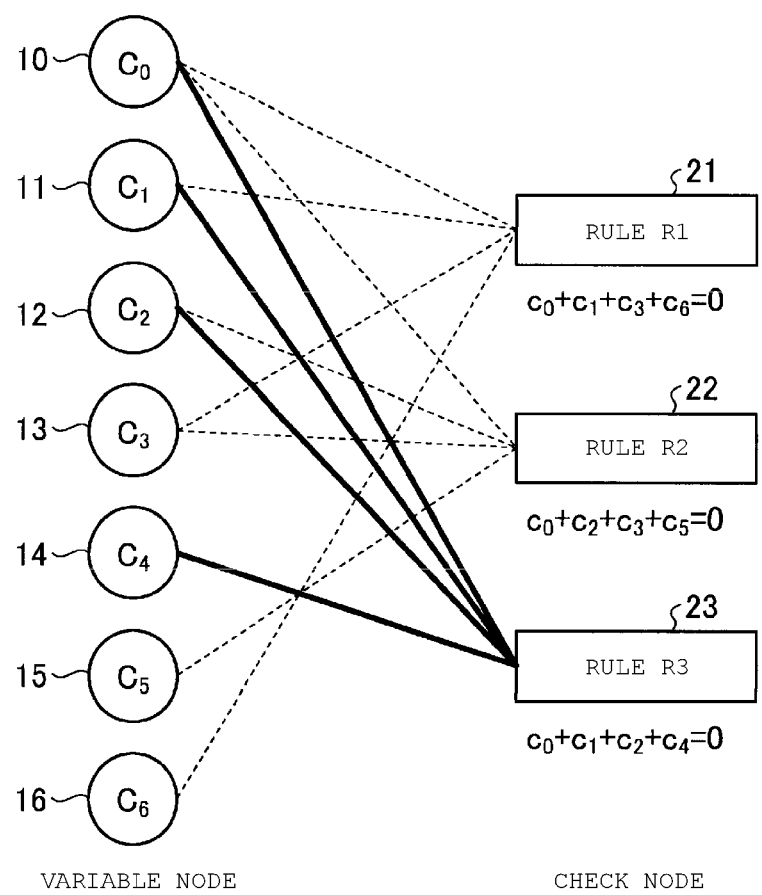
FIG. 1 illustrates an example of a Tanner graph used in Weighted-BP.

First, a brief overview of Weighted-BP will be provided. FIG. 1 is a view illustrating an example of a Tanner graph used for the Weighted-BP. An applicable graph is not limited to a Tanner graph, and another bipartite graph, such as a factor graph, may be used. The Tanner graph may be considered as a graph expressing a rule structure which a code serving as a decoding target has to satisfy. FIG. 1 the Tanner graph for a 7-bit Hamming code (an example of a code word).

Variable nodes 10 to 16 correspond to 7-bit sign bits $C_0$ to $C_6$. Check nodes 21 to 23 correspond to three rules R1, R2, and R3. The number of sign bits is not limited to 7 bits in other examples. Likewise, the number of rules is not limited to three in other examples. In FIG. 1, a rule is utilized in which the value becomes 0 when all the connected sign bits connected to a particular check node are added together. For example, the rule R3 (check box 23) represents a rule in which the addition of the sign bits $C_0$, $C_1$, $C_2$, and $C_4$ (corresponding to the variable nodes 10, 11, 12, and 14) connected to the corresponding check node 23 equals 0.

In BP, soft-decision decoding using the Tanner graph can be performed. The soft-decision decoding is a decoding method for inputting information indicating a probability that each sign bit is 0. For example, a log-likelihood ratio (LLR) in which a ratio between likelihood that the sign bit is 0 and likelihood that the sign bit is 1 is expressed using a logarithm can be used as an input of the soft-decision decoding.

In soft-decision decoding on the Tanner graph, each variable node exchanges the LLR with other variable nodes via the check node. It can then be finally determined whether the sign bit of each variable node is 0 or 1. The LLR exchanged in this way is an example of messages transmitted using the BP (example of the message passing decoding).

For example, the soft-decision decoding on the Tanner graph is performed according to the following procedure:

(1) The variable node transmits the input LLR (channel LLR) to the connected check node.

(2) The check node determines the LLR of the variable node of a transmission source, based on the LLR of the other connected variable nodes and the corresponding rule, and returns the LLR to each variable node (transmission source).

(3) The variable node updates its own LLR, based on the LLR returned from the check node and the channel LLR, and transmits the updated LLR to the check node.

The variable node determines whether the sign bit corresponding to itself is 0 or 1, based on the LLR obtained after (2) and (3) are repeated.

In this method, the message (the LLR) based on the LLR transmitted by a certain variable node may return back to the variable node via the check node. For this reason, decoding performance may be degraded in some cases.

The Weighted-BP is a method for minimizing degradation of decoding performance. According to Weighted-BP, influence of a returning message can be attenuated by multiplying a weight with the message(s) on the Tanner graph.

It is difficult to theoretically obtain a value of an optimum weight for each message. Therefore, according to the Weighted-BP, the optimum weight is obtained by converting message propagation on the Tanner graph into the neural network and expressing and learning the neural network.

Figure 2:
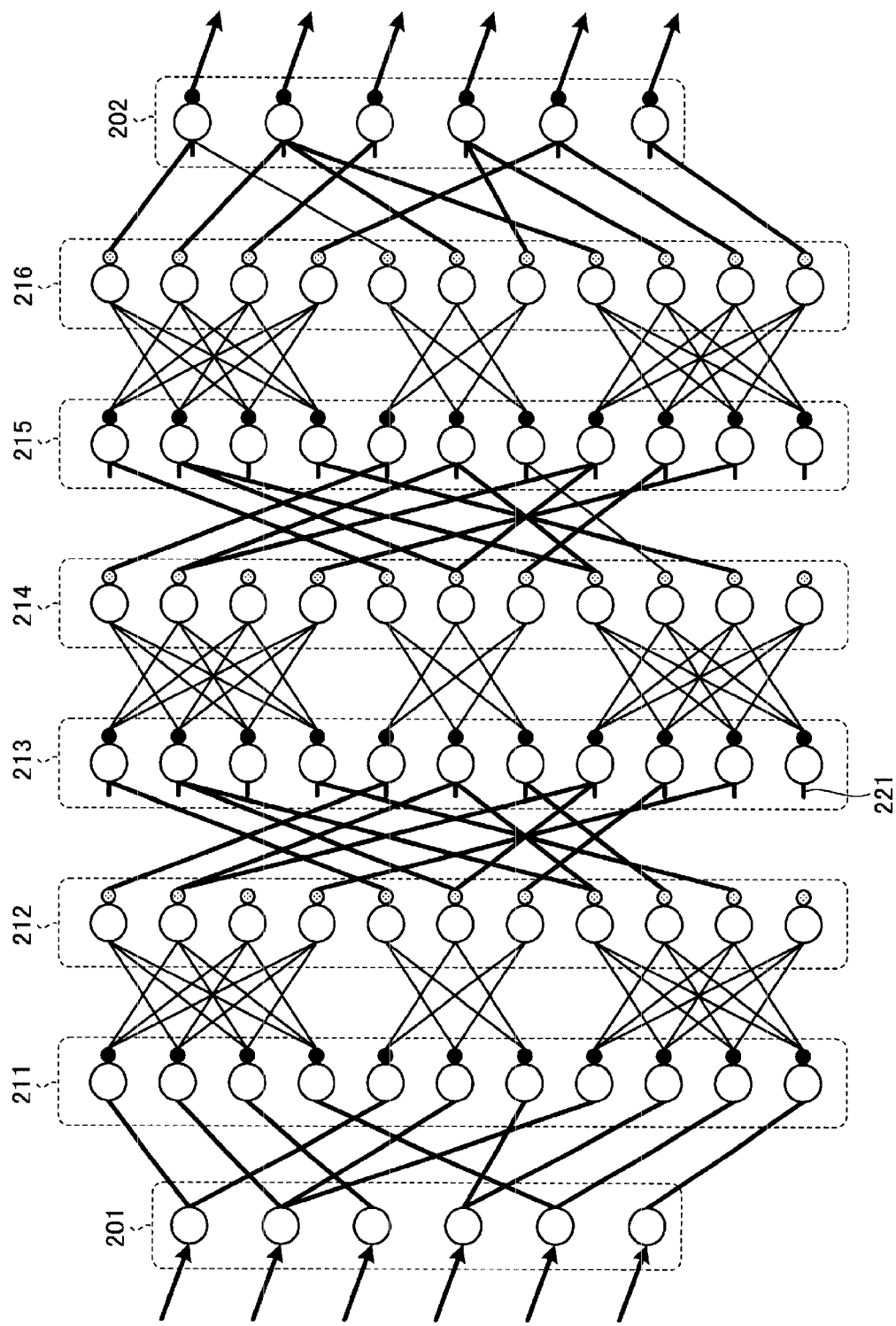
FIG. 2 illustrates an example in which message propagation on a Tanner graph is converted into a neural network.

FIG. 2 is a view illustrating an example in which the message propagation on the Tanner graph is converted into a neural network. FIG. 2 illustrates an example of a neural network that expresses the message propagation when the BP is repeated 3 times for a certain sign code in which six (6) sign bits and eleven (11) edges are provided on the Tanner graph.

The neural network includes an input layer 201, odd layers 211, 213, and 215 (which are odd-numbered intermediate layers), even layers 212, 214, and 216 (which are even-numbered intermediate layers), and an output layer 202. The input layer 201 and the output layer 202 both correspond to the variable nodes of the Tanner graph. The odd layers 211, 213, and 215 correspond to the messages propagating from a certain variable node on the Tanner graph to a check node. The even layers 212, 214, and 216 correspond to the messages propagating from a certain check node to the variable nodes on the Tanner graph. According to the BP method, when the message propagating from a certain variable node (referred to as a variable node A) to a certain check node (referred to as a check node B) is calculated, the calculation is performed using the message excluding the message propagating from the check node B out of all of the messages propagating to the variable node A, and the message obtained by performing the calculation is transmitted to the check node B. For example, a transition from the input layer 201 to the odd layer 211 corresponds to the calculation performed using the variable node in this way. For example, this calculation corresponds to an activation function in the neural network.

According to Weighted-BP, the weight assigned to the transition between the nodes of the neural network is learned. In the example illustrated in FIG. 2, the weights assigned to the transitions between the nodes (input layer 201 and odd layer 211, even layer 212 and odd layer 213, even layer 214 and odd layer 215, even layer 216 and output layer 202) indicated by thick lines are learned.

For example, the calculations in the odd layer, the even layer, and the output layer of the neural network are respectively expressed by Equations (1), (2), and (3) below.

$$x_{i,e=(v,c)} = \tanh\left(\frac{1}{2}\left(w_{i,v}l_v + \sum_{e'=(v,c'),c'\neq c} w_{i,e,e'} x_{i-1,e'}\right)\right) \quad \text{Equation (1)}$$

$$x_{i,e=(v,c)} = 2\tanh^{-1}\left(\prod_{e'=(v',c),v'\neq v} x_{i-1,e'}\right) \quad \text{Equation (2)}$$

$$o_v = \sigma\left(w_{2L+1,v}l_v + \sum_{e'=(v,c')} w_{2L+1,v,e'} x_{2L,e'}\right) \quad \text{Equation (3)}$$

Here, i is a numerical value representing an order of the intermediate layer, and for example, has a value between 1 and 2L (where L is a value obtained by dividing a total quantity of the intermediate layers by 2, and corresponds to the number of repeated BP decoding). Here, e=(v, c) is a value for identifying a transition (edge) that connects a variable node v and a check node c. Here, $x_{i,\,e}$=(v, c) represents an output to the nodes (variable node v or check node c) to which an edge identified by e=(v, c) is connected in the i-$^{th}$ intermediate layer. Here, $o_v$ represents an output to each node in the output layer.

In a case of i=1, that is, in a case of a first odd layer (odd layer 211 in the example of FIG. 2), the check node is not connected thereto in advance. Accordingly, $x_{i-1,\,e'}$ corresponding to the output from the previous layer cannot be obtained. In this case, for example, Equation 1 may be used with conditions of $x_{i-1,\,e'}$=$x_{0,\,e'}$=0. In this case, calculation using Equation 1 is equivalent to calculation using an equation in which a second term on the right side of Equation 1 does not exist.

The symbol $l_v$ represents an input LLR (channel LLR). The symbol $l_v$ is also used for the odd layer other than the first odd layer 211. In FIG. 2, for example, a short thick line such as a line 221 represents that the channel LLR is input.

Here, symbol $w_{i,\,v}$ represents a weight assigned to $l_v$ in the i$^{th}$ intermediate layer. Here, symbol $w_{i,\,e,\,e'}$ represents a weight assigned to an output ($x_{i-1,\,e'}$) from the previous layer via an edge e' other than an edge e serving as a process target. Here, symbol $w_{2L+1,\,v}$ represents a weight assigned to $l_v$ in the output layer. Symbol $w_{2L+1,\,v,\,e'}$ represents a weight assigned to an output ($x_{2L,\,e'}$) from the previous layer via the edge e' other than the edge e serving as the process target.

In this example, σ is a sigmoid function represented by $\sigma(x)=(1+e^{-x})^{-1}$.

According to the Weighted-BP, the weights included in Equations 1 and 3 above are learned. A learning method for the weights may be any desired method, and for example, a back propagation method (gradient descent method) can be used.

The neural network illustrated in FIG. 2 is an example of a feedforward neural network in which data flows in one direction. A recurrent neural network (RNN) including a recurrent structure may be used instead. In a case of the recurrent neural network, it is possible to standardize the weights to be learned.

For example, in the learning, learning data including LLR corresponding to a code word to which noise is added (a noisy code word) and a code word corresponding to correct answer data can be used. That is, the LLR is input to the neural network, and the weight is learned so that an output (corresponding to a decoding result) output from the neural network is closer to the correct answer data.

In the following embodiments, the learning data is known or generated data so that learning is not hindered.

First Embodiment

Figure 3:
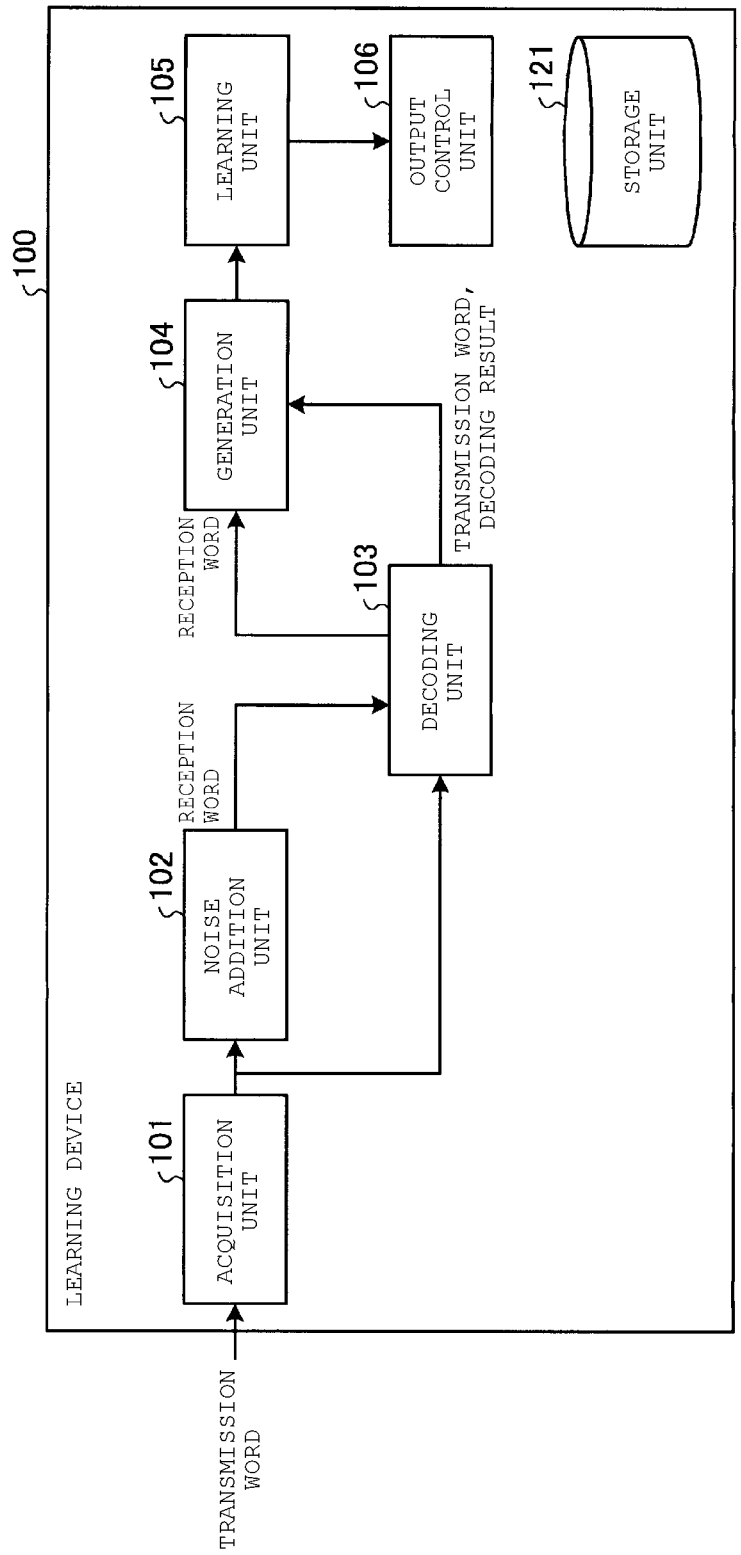
FIG. 3 is a block diagram illustrating a configuration of a learning device according to a first embodiment.

FIG. 3 is a block diagram illustrating an example of a configuration of a learning device 100 according to a first embodiment. As illustrated in FIG. 3, the learning device 100 includes an acquisition unit 101, a noise addition unit 102, a decoding unit 103, a generation unit 104, a learning unit 105, an output control unit 106, and a storage unit 121.

The acquisition unit 101 acquires various data used in various processes performed by the learning device 100. For example, the acquisition unit 101 acquires a code word (first code word) used for the learning. As a data acquisition method of the acquisition unit 101, any method may be used. For example, a method for acquiring data from an external device (such as a server device) via a communication network and a method of acquiring data by reading data stored in a storage medium may be applicable. The communication network may have any desired form. For example, the Internet or a LAN (local area network) may be adopted. The network may be wired or wireless. The first code word may vary each time the learning is performed, or may be a fixed code word. For example, in a case of a linear code, only the code word in which all sign bits are zero may be used as the first code word.

The noise addition unit 102 outputs a code word (second code word) corresponding to the acquired code word with noise added thereto. For example, the noise addition unit 102 outputs the LLR corresponding to the acquired code word to which the noise has been added as the second code word. The noise addition unit 102 calculates the LLR on an assumption that likelihood in which the sign bit is 0 and likelihood in which the sign bit is 1 respectively follow a normal distribution, and outputs the LLR as the second code word (noisy code word).

In some cases, the code word acquired by the acquisition unit 101 may be referred to as a transmission word, and the code word with added noise from the noise addition unit 102 may be referred to as a reception word.

The decoding unit 103 decodes the reception word (second code word), and outputs another code word (third code word) which is a decoding result. The decoding result obtained by the decoding unit 103 is used to determine whether the transmission word (first code word) can be used as learning data. As a decoding method of the decoding unit 103, any desired method may be used. For example, Maximum A Posteriori (MAP) decoding and Ordered Statistics Decoding (OSD) are applicable. When priority is given to decoding accuracy, the MAP decoding may be applicable, and when priority is given to a process speed, the OSD may be applicable. In this way, an applicable decoding method may be determined in view of the accuracy and the process speed.

The generation unit 104 generates the learning data for learning the weight of the Weighted-BP, based on the code word output from the decoding unit 103. For example, the generation unit 104 compares the transmission word (first code word) with the code word (third code word) as decoded by the decoding unit 103, and generates a determination result indicating whether both of these word coincide with each other. For example, the determination result may be represented by a signal that is turned on when both coincide with each other, and may be represented by a signal that is turned off when both do not coincide with each other. The generation unit 104 generates the learning data including the transmission word, the reception word, and the determination result.

The learning unit 105 learns the weight of Weighted-BP by using the learning data generated by the generation unit 104. For example, the learning unit 105 learns the weight of the neural network as described above by using the back propagation method (gradient descent method).

The reception word included in the learning data is used as an input to the neural network representing a decoding target of the Weighted-BP, that is, the Weighted-BP. The transmission word included in the learning data is used as correct answer data. That is, the learning unit 105 learns the weight so that a decoding result of the Weighted-BP for the input reception word is closer to the transmission word which is correct answer data.

In some cases, the noise is added to a code word to such an extent that the reception word cannot be decoded. According to the present embodiment, the determination result is used to prevent such a reception word (a code word having noise added to such an extent that the word cannot be decoded) from being used for the learning. That is, the learning unit 105 performs the learning with code words for which the determination result indicates that the transmission word and the code word decoded by the decoding unit 103 match with each other. In this manner, only those reception words that can be decoded by the decoding unit 103 are used for the learning. Therefore, it is possible to eliminate a possibility that learning data which actually hinders the learning will be used, and it is possible to more efficiently learn the weights used in decoding an error correction code.

The output control unit 106 controls an output of various data. For example, the output control unit 106 outputs a parameter of the neural network which includes the weight learned by the learning unit 105 to a decoding device that performs decoding by Weighted-BP. The decoding device can perform the decoding process by Weighted-BP using the learned weight.

Each of the acquisition unit 101, noise addition unit 102, decoding unit 103, generation unit 104, learning unit 105, and output control unit 106 can be implemented by one or a plurality of processors. For example, each of the above-described units may be implemented by causing a processor, such as a central processing unit (CPU), to execute a program, that is, by software. Each of the above-described units may be implemented by a processor, such as a dedicated integrated circuit (IC), that is, by hardware. Each of the above-described units may be implemented by a combination of the software and the hardware. When a plurality of processors are used, each processor may serve as one of the respective units or two or more units out of the respective units.

The storage unit 121 stores various data used in various processes performed by the learning device 100. For example, the storage unit 121 stores data such as the code word acquired by the acquisition unit 101, the learning data, and the parameter (weight) of the neural network which represents the Weighted-BP. The storage unit 121 can be any commonly used storage medium such as a flash memory, a memory card, a random access memory (RAM), a hard disk drive (HDD), and an optical disk.

Figure 4:
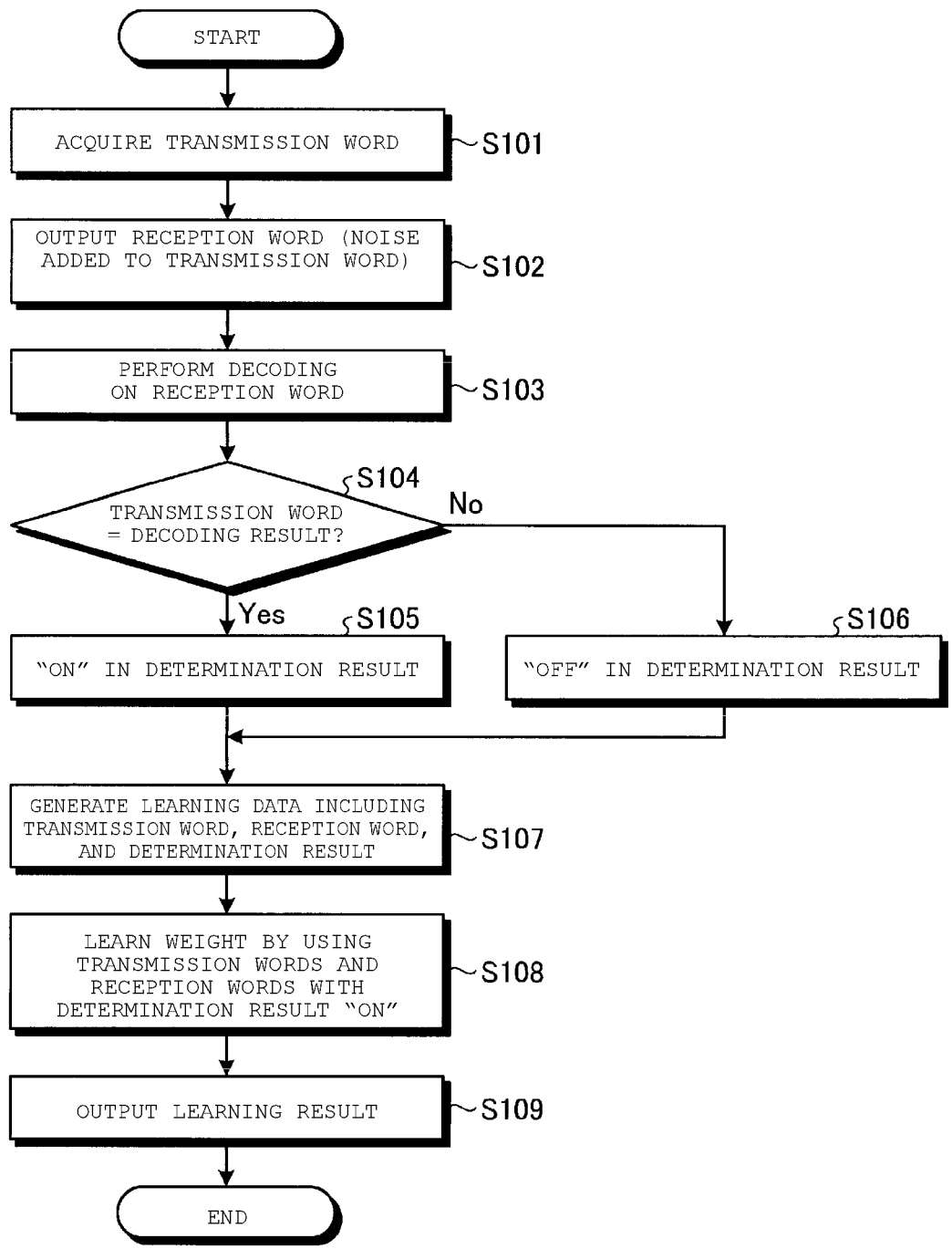
FIG. 4 is a flowchart of an example of a learning process in a first embodiment.

Next, a learning process performed by the learning device 100 according to the first embodiment. FIG. 4 is a flowchart of an example of the learning process in the first embodiment.

The acquisition unit 101 acquires a transmission word (Step S101). The noise addition unit 102 outputs a reception word with added noise (e.g., the reception word=the transmission word+random noise) (Step S102). The decoding unit 103 performs the decoding on the reception word (Step S103). The generation unit 104 determines whether or not the transmission word and a decoding result obtained by the decoding unit 103 coincide with each other (Step S104).

When both coincide with each other (Step S104: Yes), the generation unit 104 sets a determination result (for example, ON) indicating that both coincide with each other (Step S105). When both do not coincide with each other (Step S104: No), the generation unit 104 sets a determination result (for example, OFF) indicating that both do not coincide with each other (Step S106). The generation unit 104 generates learning data including the transmission word, the reception word, and the determination result, and outputs the learning data to the learning unit 105 (Step S107). The generation unit 104 may output the generated learning data to the storage unit 121, and the learning unit 105 may use the learning data output to the storage unit 121.

When the determination result included in the learning data indicates ON, the learning unit 105 learns (calculates) the weight of the Weighted-BP by using the transmission word and the reception word which are included in the learning data (Step S108). The output control unit 106 outputs the learning result to a decoding device, for example (Step S109).

A timing at which the learning unit 105 performs the learning may be set in any desired manner. For example, the learning may be performed each time the generation unit 104 generates the learning data (online learning), or the learning may be performed when a prescribed number of the learning data is generated (offline learning or mini-batch learning). When the learning is performed by setting the prescribed number of the learning data as a learning target, the learning unit 105 may perform the learning, for example, when the prescribed number of the learning data whose determination result is ON is input.

Modification Example

Figure 5:
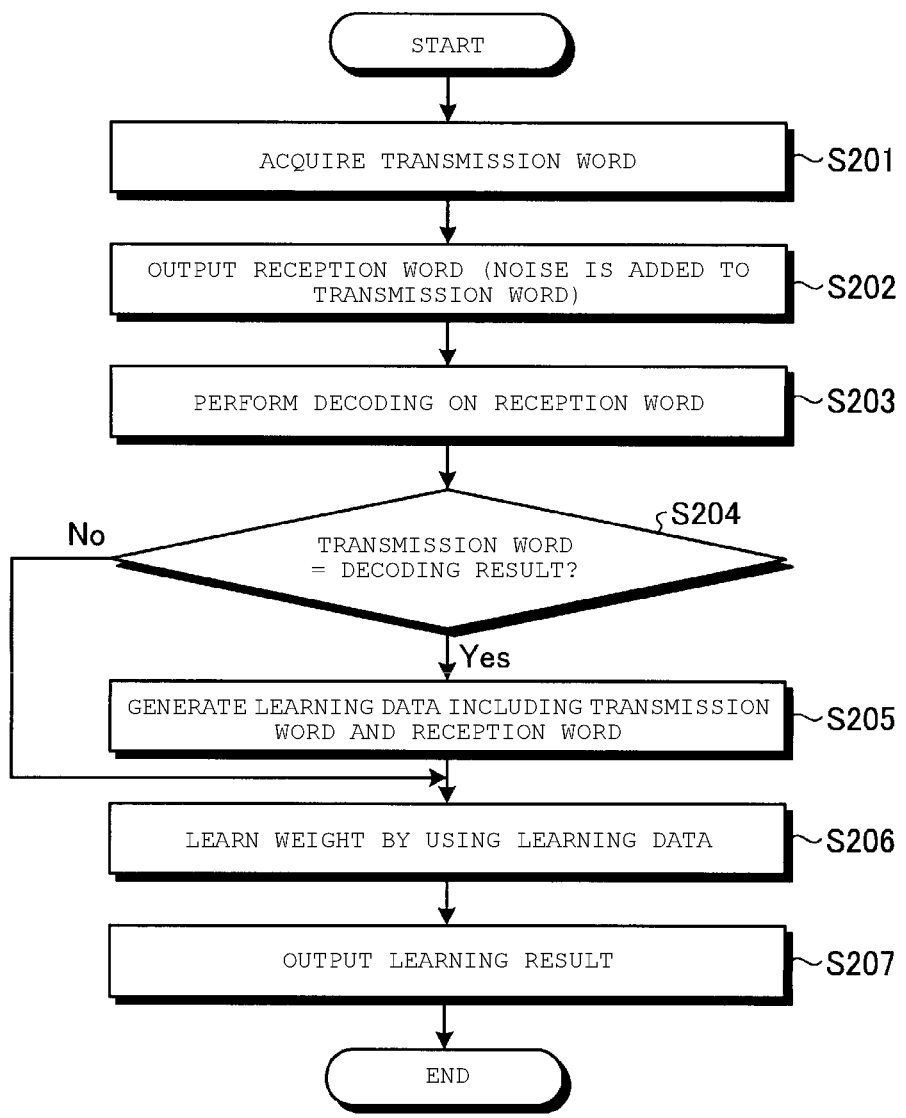
FIG. 5 is a flowchart of an example of a learning process in a modification example.

When the prescribed number of the learning data is set as the learning target, learning data that does not include the determination result may be generated and used. FIG. 5 is a flowchart of an example of a learning process according to a modification example configured to use the learning data that does not include the determination result. Step S201 to Step S204 are the same as Step S101 to Step S104 in FIG. 4.

In the modification example, when the transmission word and the decoding result obtained by the decoding unit 103 coincide with each other (Step S204: Yes), the generation unit 104 generates learning data that includes the transmission word and the reception word, but does not separately include the determination result (Step S205). When the transmission word and the decoding result obtained by the decoding unit 103 do not coincide with each other (Step S204: No), the generation unit 104 does not perform a generation process for the learning data.

In the modification example, the learning unit 105 performs the learning by using the learning data that does not include the determination result (Step S206). For example, the learning unit 105 does not need to perform the process for determining whether or not the learning determination result is ON, and simply uses the learning data generated by the generation unit 104 for the learning. The output control unit 106 outputs the learning result to a decoding device, for example (Step S207).

In the modification example, the generation process of the learning data which might hinder the learning is omitted. Accordingly, as in the first embodiment, it is possible to more efficiently learn the weight used in decoding the error correction code.

Second Embodiment

Figure 6:
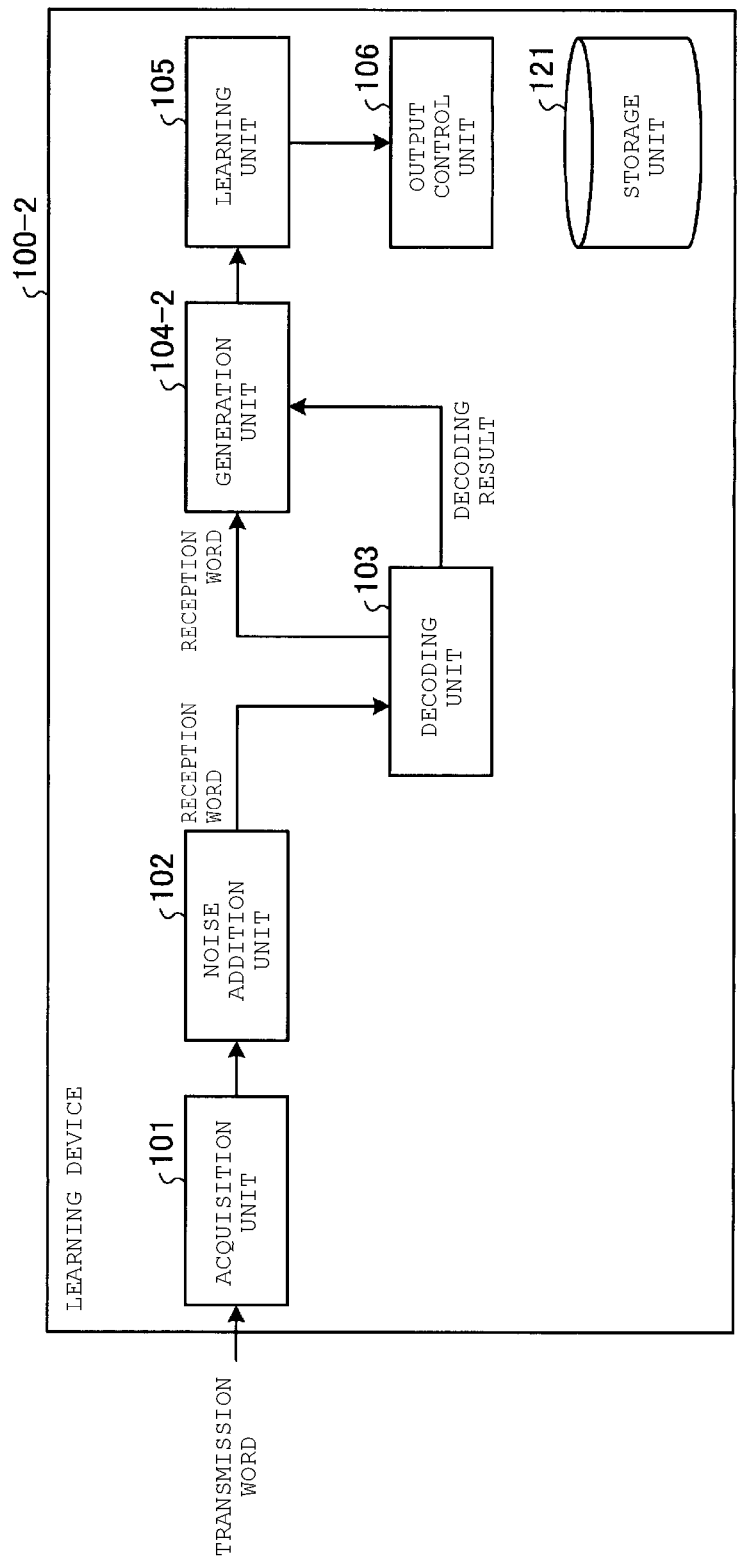
FIG. 6 is a block diagram illustrating a configuration of a learning device according to a second embodiment.

FIG. 6 is a block diagram illustrating an example of a configuration of a learning device 100-2 according to a second embodiment. As illustrated in FIG. 6, the learning device 100-2 according to the second embodiment includes an acquisition unit 101, a noise addition unit 102, a decoding unit 103, a generation unit 104-2, a learning unit 105, an output control unit 106, and a storage unit 121.

In the second embodiment, a function of the generation unit 104-2 is different from that of the first embodiment.

Other configurations and functions are the same as those in of learning device 100 according to the first embodiment.

The generation unit 104-2 generates the learning data including the reception word and the code word (decoding result, third code word) decoded by the decoding unit 103. That is, in the present embodiment, the decoding result obtained by the decoding unit 103 is used as the correct answer data instead of the transmission word (first code word).

In this context, the decoding result refers to a result of the decoding process performed by the decoding unit 103 on the reception word, which is the transmission word to which the noise is added. In the second embodiment, only those reception words that can be decoded by the decoding unit 103 are used for generating the learning data. That is, if noise is added to such an extent that the reception word cannot be decoded by the decoding unit 103, then such a reception word will not be included in the learn data. Therefore, the learning data generated by the generation unit 104-2 does not include those reception words to which the noise has been added to such an extent that the code word cannot be decoded.

In the second embodiment, as in the above-described modification example, the learning unit 105 can perform the learning by using all learning data generated by the generation unit 104-2 without necessity for sorting or filtering out code words that could not be decoded.

Figure 7:
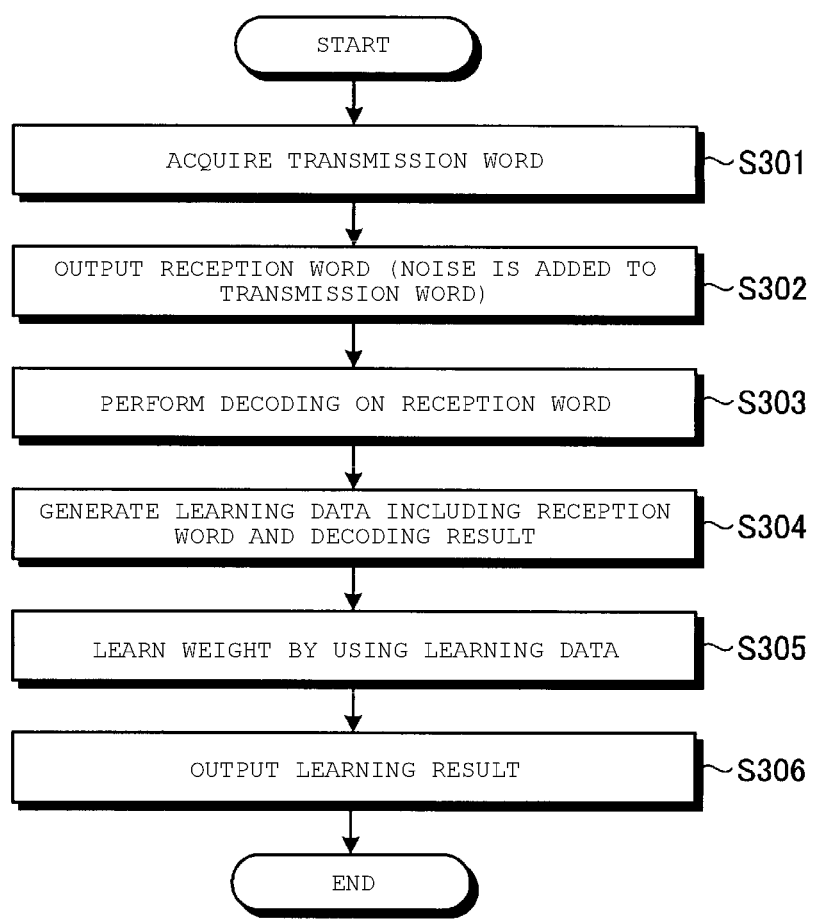
FIG. 7 is a flowchart of an example of a learning process in a second embodiment.

Next, a learning process performed by the learning device 100-2 according to the second embodiment will be described. FIG. 7 is a flowchart of an example of the learning process in the second embodiment. Step S301 to Step S303 are the same as Step S101 to Step S103 in FIG. 4.

The generation unit 104-2 generates the learning data including the reception word and the decoding result (third code word) provided by the decoding unit 103 (Step S304). The learning unit 105 uses the learning data generated by the generation unit 104-2, and learns the weight of the Weighted-BP (Step S305). The output control unit 106 outputs the learning result to a decoding device, for example (Step S306).

In the second embodiment, the learning data is generated including the reception word and the decoding result obtained from the decoding unit 103 decoding of the reception word. This generated learning data is used in learning the weight. The learning data does not include those reception words for which noise was added to such an extent that the decoding could not be performed. Therefore, it is possible to more efficiently learn the weight by avoiding a possibility that the learning may be hindered by undecipherable reception words.

In the first embodiment, the reception words that cannot be decoded are not used as the learning data. Therefore, any time spent performing the generation process of such unused learning data is wasted, thereby possibly hindering learning speed. However, in the second embodiment, all generated learning data can be used.

Third Embodiment

Figure 8:
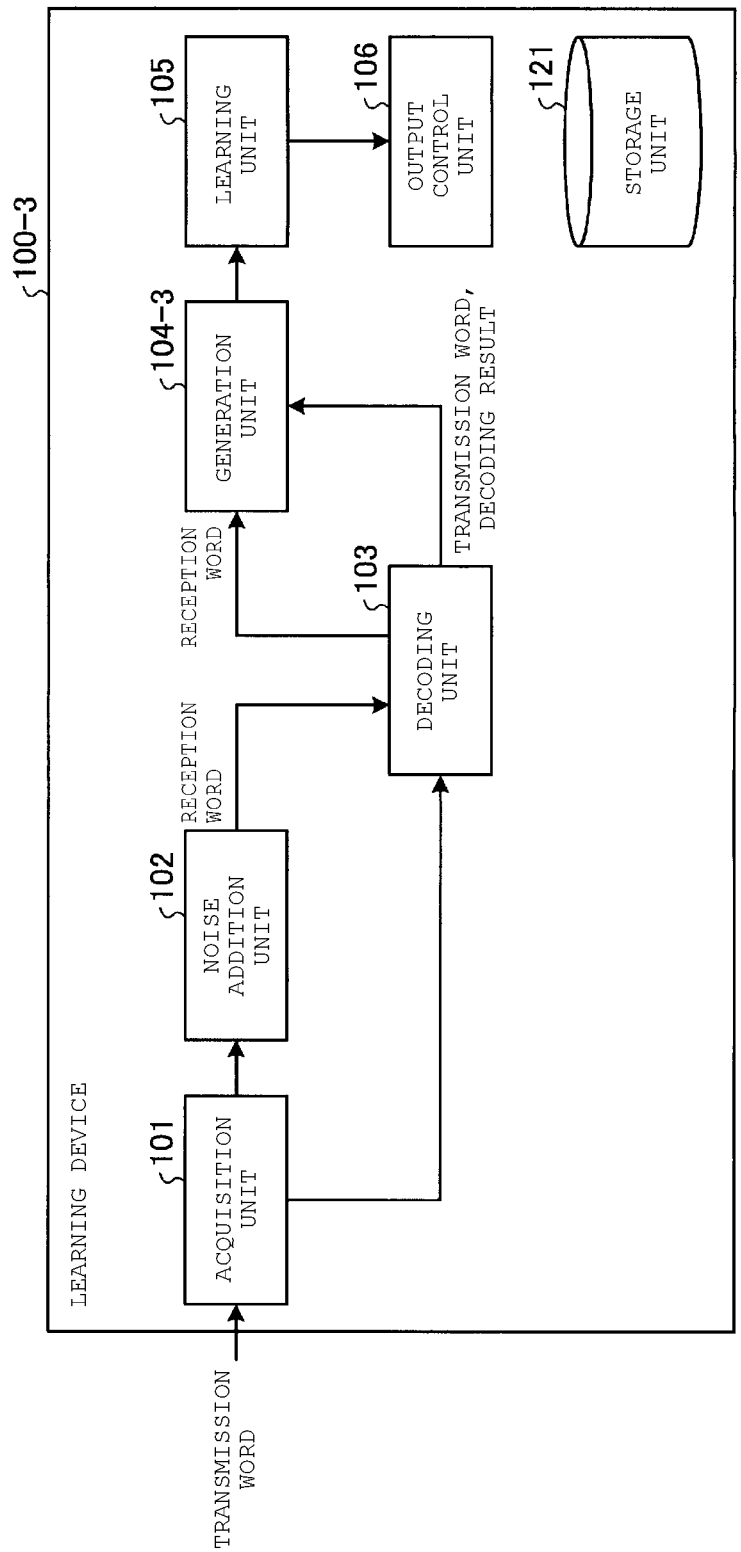
FIG. 8 is a block diagram illustrating a configuration of a learning device according to a third embodiment.

FIG. 8 is a block diagram illustrating an example of a configuration of a learning device 100-3 according to a third embodiment. As illustrated in FIG. 8, the learning device 100-3 includes an acquisition unit 101, a noise addition unit 102, a decoding unit 103, a generation unit 104-3, a learning unit 105, an output control unit 106, and a storage unit 121.

In the third embodiment, a function of the generation unit 104-3 is different from that of the first embodiment. Other configurations and functions are the same as those of the learning device 100 according to the first embodiment.

The generation unit 104-3 compares the transmission word (first code word) with the decoded code word (third code word) provided by the decoding unit 103, and generates the learning data including the transmission word and the reception word, when both of first and third code words coincide with each other. When both of these do not coincide with each other, the generation unit 104-3 converts the reception word so that it can be decoded (back into the original transmission word), and generates the learning data including the converted reception word (a fourth code word) and the transmission word (first code word). For example, the generation unit 104-3 converts the LLR, which is the reception word in this context, so that positive and negative signs corresponding to bit values are manipulated (e.g., flipped) in the LRR (reception word) so the transmission word and the decoding result coincide. If the converted LLR can be decoded by the decoding unit 103, the transmission word is obtained as the decoding result. Therefore, the converted LLR is effectively a reception word to which the added noise is only to an extent that still permits decoding back to the transmission word. That is, in the third embodiment, the reception words included in the learning data are not those reception words that cannot be decoded (whether before or after conversion). That is, only reception words (whether before or after conversion) that can be decoded to the transmission word are included in the learning data.

Figure 9:
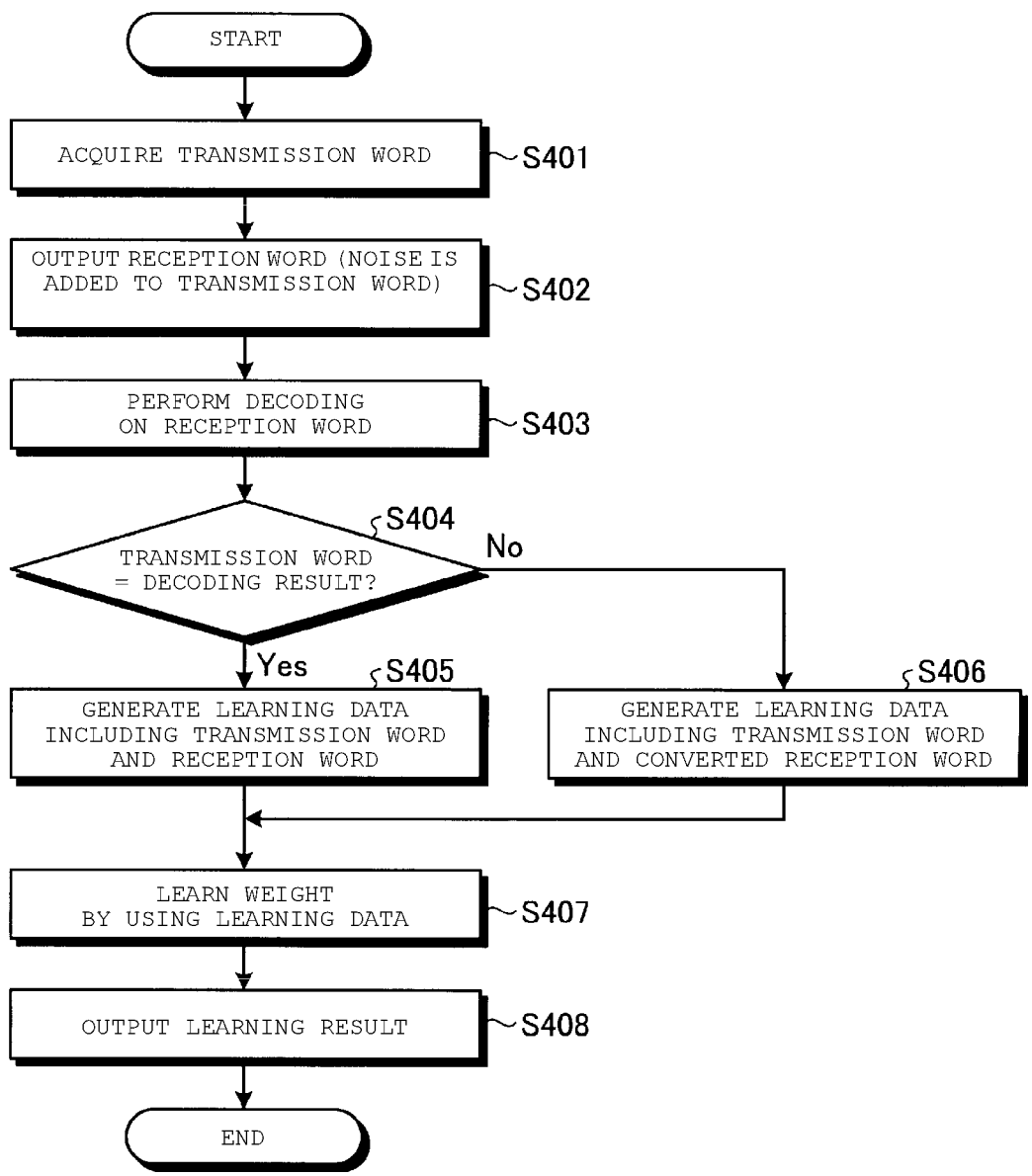
FIG. 9 is a flowchart of an example of a learning process in a third embodiment.

Next, a learning process performed by the learning device 100-3 according to the third embodiment will be described. FIG. 9 is a flowchart of an example of the learning process in the third embodiment. Step S401 to Step S404 are the same as Step S101 to Step S104 in FIG. 4.

When the transmission word and the decoding result coincide with each other (Step S404: Yes), the generation unit 104-3 generates the learning data including the transmission word and the reception word (Step S405). When the transmission word and the decoding result do not coincide with each other (Step S404: No), the generation unit 104-3 converts (e.g., manipulates bitwise) the reception word so that the reception word can be decoded into the transmission word, and generates the learning data including the converted reception word and the transmission word. (Step S406).

The learning unit 105 learns the weight of the Weighted-BP by using the learning data generated by the generation unit 104-3 (Step S407). The output control unit 106 outputs the learning result to the decoding device, for example (Step S408).

As described above, in the third embodiment, when the transmission word and the decoding result do not coincide with each other, the reception word is converted (changed) so that the transmission word can be decoded. The leaning data may include a converted reception word, but does not include those reception words for which the decoding cannot be performed. Therefore, it is possible to more efficiently learn the weight by avoiding a possibility that the learning may be hindered by undecipherable reception words. All learning data generated as in the fourth embodiment can be used. Therefore, it is possible to prevent the learning speed from being hindered.

Figure 10:
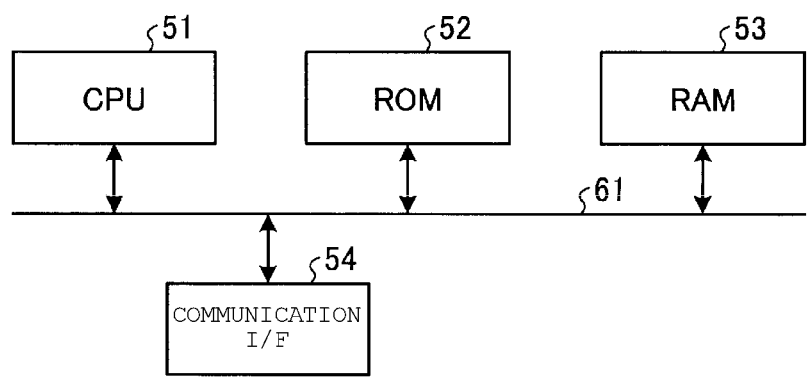
FIG. 10 depicts a hardware configuration of a learning device according to first to third embodiments.

Next, a hardware configuration of the learning device according to the first to third embodiments will be described with reference to FIG. 10. FIG. 10 is a view illustrating a hardware configuration example of learning devices according to the first to third embodiments.

The learning device according to the first to third embodiments includes a control device, such as a central processing unit (CPU) 51, a storage device, such as a read only memory (ROM) 52 and a random access memory (RAM) 53, a communication I/F 54, connected to a network for communication, and a bus 61 for connecting the respective units to each other.

The program executed by the learning device according to the first to third embodiments can be provided by being pre-installed in the ROM 52.

The program executed by the learning devices according to the first to third embodiments may be provided as a computer program product in which files in an installable format or an executable format are recorded on a non-transitory computer-readable recording medium such as a compact disk read only memory (CD-ROM), a flexible disk (FD), a compact disk recordable (CD-R), and a digital versatile disk (DVD).

Furthermore, the program executed by the learning devices according to the first to third embodiments may be provided as follows. The program may be stored in a computer connected to a network such as the Internet, and may be downloaded via the network. The program executed by the learning devices according to the first to third embodiments may be provided or distributed via a network such as the Internet.

In some examples, a program executed by the learning device according to the first to third embodiments may cause a general purpose computer to function as each unit of the above-described learning device. In a computer, the CPU 51 can execute the program by reading the program from a computer-readable storage medium onto a main storage device.

For example, the learning device according to the first to third embodiments can be implemented by a server device and a personal computer which both have the hardware configuration illustrated in FIG. 10. The hardware configuration of the learning device is not limited thereto, and may be constructed as a server device in a cloud environment, for example.

Fourth Embodiment

In the above-described embodiments, an example has been described in which the device (decoding device) that performs the decoding by using the Weighted-BP and the learning device are separate or distinct devices. However, a device that performs the decoding may have a function as the learning device. In a fourth embodiment, an example will be described in which a memory system having a function of decoding data (reception words) read from a storage device also functions as the learning device.

Applicable systems are not limited to such a memory system. For example, a communication device having a function of decoding data transmitted via a network by using the Weighted-BP may further function as the learning device as in the above-described embodiments.

Hereinafter, an example will be described in which the memory system has the function of the learning device 100 according to the first embodiment. In other examples, the memory system may have the function of the learning device according to the modification example, the second embodiment, or the third embodiment.

Figure 11:
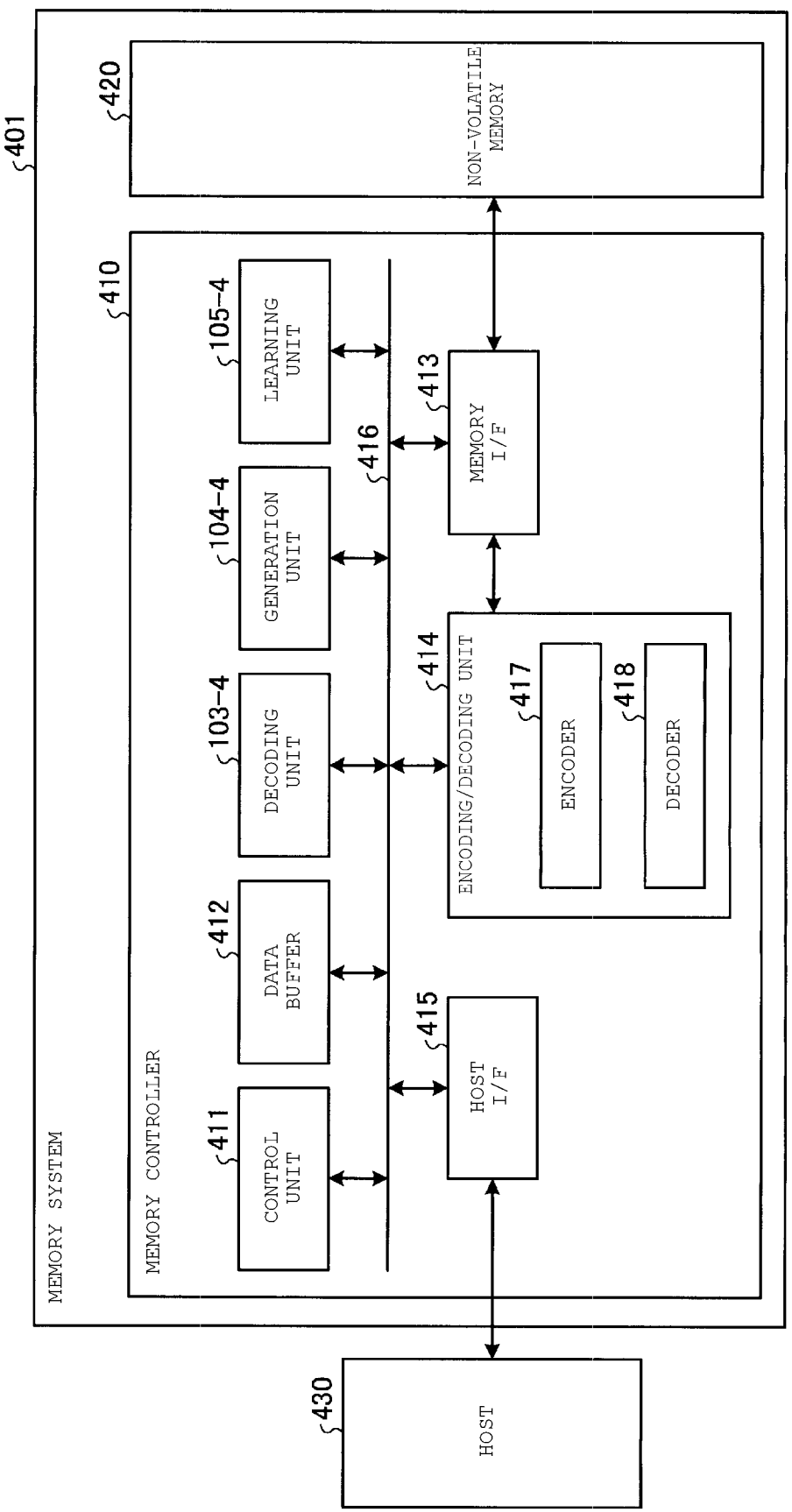
FIG. 11 is a block diagram of a memory system according to a fourth embodiment.

FIG. 11 is a block diagram illustrating a schematic configuration example of a memory system according to the fourth embodiment. As illustrated in FIG. 11, a memory system 401 includes a memory controller 410 and a non-volatile memory 420. The memory system 401 can be connected to a host 430. FIG. 11 illustrates a state where the memory system 401 is connected to the host 430. For example, the host 430 may be an electronic device such as a personal computer or a mobile terminal (e.g., a smartphone).

The non-volatile memory 420 stores data in a non-volatile manner and is a NAND flash memory (hereinafter, simply referred to as a NAND memory). In the following description, a case will be described where the NAND memory is used as the non-volatile memory 420. As the non-volatile memory 420, it is also possible to use a storage device other than the NAND memory, such as a three-dimensional structure flash memory, a resistance random access memory (ReRAM), and a ferroelectric random access memory (FeRAM). It is not essential that the non-volatile memory 420 be a semiconductor type memory, and the present embodiment is applicable to various storage media other than semiconductor type memory.

The memory system 401 may be a memory card in which the memory controller 410 and the non-volatile memory 420 are configured as one package, or may be a solid state drive (SSD).

The memory controller 410 controls writing in the non-volatile memory 420 in accordance with a write request from the host 430. Reading from the non-volatile memory 420 is controlled in accordance with a read request from the host 430. The memory controller 410 includes a host interface (I/F) 415, a memory interface (I/F) 413, a control unit 411, an encoding/decoding unit 414 (codec unit), a data buffer 412, a decoding unit 103-4, a generation unit 104-4, and a learning unit 105-4. The host I/F 415, the memory I/F 413, the control unit 411, the encoding/decoding unit 414, and the data buffer 412 are connected to each other by an internal bus 416.

The host I/F 415 performs a process in accordance with a standard interface protocol or the like with the host 430, and outputs a command received from the host 430 and user data on a writing target to the internal bus 416. The host I/F 415 transmits the user data restored by being read from the non-volatile memory 420 or a response from the control unit 411, to the host 430.

The memory I/F 413 performs a write operation on the non-volatile memory 420, based on an instruction of the control unit 411. The memory I/F 413 performs a read operation from the non-volatile memory 420, based on an instruction from the control unit 411.

The data buffer 412 temporarily stores the user data received by the memory controller 410 from the host 430 until the user data can be stored in the non-volatile memory 420. The data buffer 412 temporarily stores the user data read from the non-volatile memory 420 until the user data can be transmitted to the host 430. For example, as the data buffer 412, a general-purpose memory such as a static random access memory (SRAM) or a dynamic random access memory (DRAM) may be used.

The control unit 411 controls each element of the memory system 401. When receiving a command from the host 430 via the host I/F 415, the control unit 411 performs control in accordance with the command. For example, the control unit 411 instructs the memory I/F 413 to write the user data and parity information in the non-volatile memory 420 in accordance with a command from the host 430. Further, the control unit 411 instructs the memory I/F 413 to read the user data and the parity information from the non-volatile memory 420 according to the command from the host 430.

When the control unit 411 receives a user data write request from the host 430, the control unit 411 determines a storage area (memory location) in the non-volatile memory 420 for the user data accumulated in the data buffer 412. That is, the control unit 411 manages a writing destination of the user data. A correspondence between a logical address of the user data received from the host 430 and a physical address indicating the storage area in the non-volatile memory 420 having the stored user data is stored as an address conversion table.

When receiving a read request from the host 430, the control unit 411 converts the logical address designated by the read request into the physical address by using the address conversion table, and instructs the memory I/F 413 to perform reading from the physical address.

In the NAND memory, a plurality of memory cells connected to the same word line in the NAND memory are called a memory cell group. In NAND memory, generally, writing is performed in a memory cell group unit, reading is performed in a data unit called a page, and erasing is performed in a data unit called a block. When the memory cell is a single level cell (SLC), one memory cell group corresponds to one page. When the memory cell is a multi-level cell (MLC), one memory cell group corresponds to a plurality of pages. Each of the memory cells is connected to a word line, and is also connected to a bit line. Therefore, each of the memory cells can be identified by an address identifying a respective word line and an address identifying a respective bit line.

The user data transmitted from the host 430 is transferred to the internal bus 416, and is temporarily stored in the data buffer 412. The encoding/decoding unit 414 encodes the user data to be stored in the non-volatile memory 420, and generates a code word therefrom. The encoding/decoding unit 414 also decodes the reception word as read from the non-volatile memory 420, and restores the user data. The encoding/decoding unit 414 includes an encoder 417 and a decoder 418. The data encoded by the encoding/decoding unit 414 may include control data used inside the memory controller 410 in addition to the user data.

Next, a write operation according to the fourth embodiment will be described. The control unit 411 instructs the encoder 417 to encode the user data when the user data is written in the non-volatile memory 420. In this case, the control unit 411 determines a storage location (storage address) for the resulting code word in the non-volatile memory 420, and instructs the memory I/F 413 to store the determined storage location.

Based on the instruction from the control unit 411, the encoder 417 encodes the user data in the data buffer 412, and generates the code word. For example, as an encoding method, it is possible to adopt an encoding method using a Bose-Chandhuri-Hocquenghem (BCH) code or a Reed Solomon (RS) code. The memory I/F 413 performs control so the code word will be stored in the storage location of the non-volatile memory 420 which is instructed by the control unit 411.

Next, a process of the reading from the non-volatile memory 420 according to the fourth embodiment will be described. When reading from the non-volatile memory 420 is performed, the control unit 411 designates an address in the non-volatile memory 420, and instructs the memory I/F 413 to perform the reading. The control unit 411 instructs the decoder 418 to start the decoding. The memory I/F 413 reads the reception word from the designated address of the non-volatile memory 420 in accordance with the instruction of the control unit 411, and inputs the read reception word to the decoder 418. The decoder 418 decodes the reception word read from the non-volatile memory 420.

In the fourth embodiment, the decoder 418 decodes the reception word by using Weighted-BP. A parameter such as the weight used for the Weighted-BP is stored in the data buffer 412, for example. That is, the function of the storage unit 121 according to the first embodiment may be implemented by the data buffer 412, for example.

The decoding unit 103-4, the generation unit 104-4, and the learning unit 105-4 are provided for learning the weight of Weighted-BP.

In the present embodiment, the reception word read from the non-volatile memory 420 is used as the noisy code word (the second code word) corresponding to the original data (the first code word) to which noise was added. Therefore, it is not necessary to provide the functions corresponding to the acquisition unit 101 and the noise addition unit 102 as in the first embodiment. Likewise, the learning result does not need to be output to an external decoding device. Accordingly, it is not necessary to provide a function corresponding to the output control unit 106 of the first embodiment.

The decoding unit 103-4 decodes the data (reception word) read from the non-volatile memory 420. A decoding method used by the decoding unit 103-4 may be any desired method. For example, the MAP decoding and the OSD decoding are applicable.

The generation unit 104-4 generates the learning data for learning the weight of the Weighted-BP, based on the code word output by the decoding unit 103-4. For example, the generation unit 104-4 compares the transmission word with the code word as decoded by the decoding unit 103, and generates a determination result indicating whether or not both of these coincide with each other (ON when both of these coincide with each other, or OFF when both of these do not coincide with each other). The generation unit 104-4 generates the learning data including the transmission word, the reception word, and the determination result.

The learning unit 105-4 uses the learning data generated by the generation unit 104-4, and learns the weight of the Weighted-BP. The learning unit 105-4 stores the learning result (learned weight) in the data buffer 412, for example. The stored weight is used for a subsequent decoding process performed by the decoder 418.

Figure 12:
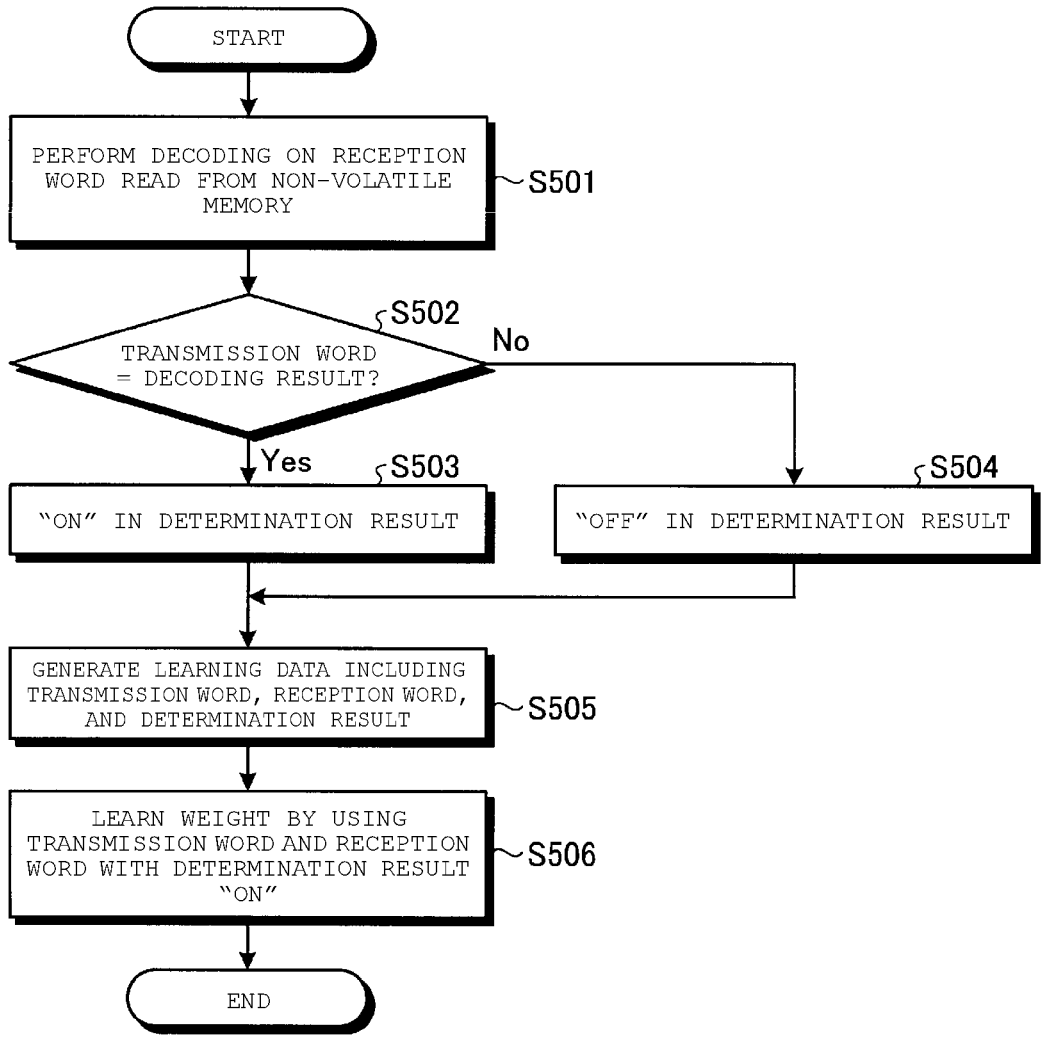
FIG. 12 is a flowchart of an example of a learning process in a fourth embodiment.

Next, a learning process performed by the memory system 401 according to the fourth embodiment will be described. FIG. 12 is a flowchart of an example of the learning process in the fourth embodiment.

The timing for the learning process may be set in any desired manner. For example, the learning process may be performed each time a reception word is read from the non-volatile memory 420. The timing for the learning process may be set to select only certain reception words which satisfies a predetermined condition. For example, as an error correction process in the memory system 401, in some cases, the following method is used. First, a high-speed error correction process is performed, when the decoding fails, the decoding process is switched to a stronger but low-speed decoding process in a stepwise manner. In this case, for example, the learning process may be performed when the decoding fails in the first high-speed error correction process, or when the BP decoding is performed as the low-speed decoding in a subsequent step. The learning process is performed by the decoding unit 103-4, the generation unit 104-4, and the learning unit 105-4 in accordance with an instruction from the control unit 411, for example.

In the fourth embodiment, when the learning process is performed based on the first embodiment, the modification example of the first embodiment, or the third embodiment, a transmission word (writing value in the non-volatile memory 420) is required at the time of learning. Therefore, when the code word is written in the non-volatile memory 420, the written code word is kept stored in the data buffer 412. At the time of learning, the required code word (first code word) may be read from the data buffer 412 to perform the learning process. The code word may be deleted from the data buffer 412 when the learning process is completed. In the fourth embodiment, when the learning process is performed based on the second embodiment, it is not necessary to use the transmission word (first code word) at the time of learning. Accordingly, it is not necessary to perform a process for holding the written code word in the data buffer 412.

The control unit 411 may have a mechanism that determines whether or not to perform the learning process in accordance with an operation status of the memory system 401. For example, the control unit 411 may instruct the learning process to be performed only when a CPU operation rate of the memory system 401 is equal to or less than a certain threshold. For example, the control unit 411 may not issue an instruction to perform the learning process until a prescribed time elapses after the previous learning process.

The decoding unit 103-4 decodes the reception word read from the non-volatile memory 420 (Step S501). The generation unit 104-4 determines whether or not the transmission word and the decoding result obtained by the decoding unit 103-4 coincide with each other (Step S502).

When both coincide with each other (Step S502: Yes), the generation unit 104-4 sets the determination result (ON) indicating that both coincide with each other (Step S503). When both do not coincide with each other (Step S502: No), the generation unit 104-4 sets the determination result (OFF) indicating that both do not coincide with each other (Step S504). The generation unit 104-4 generates the learning data including the transmission word, the reception word, and the determination result, and outputs the learning data to the learning unit 105-4 (Step S505).

When the determination result included in the learning data indicates ON, the learning unit 105-4 learns the weight of the Weighted-BP by using the transmission word and the reception word which are included in the learning data (Step S506). The learning unit 105-4 stores the learning result in the data buffer 412, for example.

As described above, in the fourth embodiment, the device that performs the decoding also has a function of learning the weight used for Weighted-BP. The learning data that does not include the reception words that are too noisy to decode. Therefore, it is possible to more efficiently learn the weight by avoiding a possibility that the learning may be hindered.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A learning device, comprising:
   a memory unit configured to store a first code word; and
   a processor connected to the memory unit, the processor configured to:
   receive the first code word and then generate a second code word from the first code word by adding noise to the first code word;
   decode the second code word in a first decoding process and then output a decoding result of the first decoding process as a third code word;
   determine whether the third code word matches the first code word;
   include the second code word in a learning data set when the third code word from the first decoding process matches the first code word; and
   calculate a weighting value for a second decoding process from the learning data set, the second decoding process being a message passing decoding in which a message transmitted in the message passage decoding is multiplied by the weighting value.

2. The learning device according to claim 1, wherein the learning data set includes the first code word, the second code word, and a determination result indicating whether the first code word and the third code word match each other.

3. The learning device according to claim 1, wherein the learning data set includes just the first code word and the second code word when the first code word and the third code word match each other.

4. The learning device according to claim 1, wherein learning data set includes just the third code word and the second code word.

5. The learning device according to claim 1, wherein the processor is further configured to:
   manipulate a bit of the second code word when the third code word does not match the first code word and generate a fourth code word from the manipulated second code word, and
   include the fourth code word in the learning data set when the fourth code word can be decoded and the decoding result thereof matches the first code word.

6. The learning device according to claim 1, wherein the processor is further configured to:
   include the first code word and the second code word in the learning data set when the first code word and the third code word match each other, and
   include the third code word and a fourth code word in the learning data when the first code word and the third code word do not match each other, the fourth code word being obtained by converting the second code word by switching a bit of the second code word.

7. The learning device according to claim 1, wherein the second decoding process is a belief-propagation algorithm in which the calculated weighting value and a transmitted message are multiplied with one another.

8. The learning device according to claim 1, wherein the second decoding process uses a neural network having the weighting value as a parameter.

9. The learning device according to claim 1, wherein the processor decodes the second code word in the first decoding process using a maximum a posteriori (MAP) decoding or ordered statistics decoding (OSD).

10. The learning device according to claim 1, wherein the processor is further configured to supply the calculated weighting value to an error correction encoding/decoding unit for use as a parameter in error correction decoding processing of the error correction encoding/decoding unit.

11. The learning device according to claim 1, wherein the memory unit is NAND flash memory.

12. A memory system, comprising:
   a memory controller including:
      a host interface for receiving data from a host device,
      a memory interface for receiving data from a memory unit,
      an error correction encoding/decoding unit for encoding and decoding data to be written to and read from the memory unit,
      a data buffer for storing data to be written to the memory unit and data read from the memory unit, and
   a learning device including a processor, wherein
   the memory controller is configured to:
      receive first data from the host device via the host interface,
      encode the first data using the error correction encoding/decoding unit to generate a first code word,
      store the first code word in the data buffer,
      write the first code word to a first location in the memory unit via the memory interface,
      read data from the first location of the memory unit via the memory interface, and
      supply the read data to the learning device as a second code word; and
   the processor of the learning device is configured to:
      decode the second code word to generate a third code word as a decoding result of a first decoding processing;
      determine whether the third code word matches the first code word,
      include the second code word in a learning data set when the third code word matches the first code word, and
      calculate a weighting value from the learning data set for a subsequent message passing decoding operation in which a message transmitted in the message passage decoding in multiplied by the weighting value.

13. The memory system according to claim 12, wherein the message passing decoding operation corresponds to a belief-propagation algorithm in which the transmitted message is multiplied by the calculated weighting value.

14. The memory system according to claim 12, wherein the learning device is configured to supply the calculated weighting value to the error correction encoding/decoding unit.

15. The memory system according to claim 12, wherein the memory unit is NAND flash memory.

16. The memory system according to claim 12, wherein the processor of the learning device is further configured to:
   include the first code word and the second code word in the learning data set when the first code word and the third code word match each other, and
   include the third code word and a fourth code word in the learning data when the first code word and the third code word do not match each other, the fourth code word being obtained by converting the second code word by switching a bit of the second code word.

17. The memory system according to claim 12, wherein the processor decodes the second code word in the first decoding processing using a maximum a posteriori (MAP) decoding or ordered statistics decoding (OSD).

18. The memory system according to claim 12, wherein the processor of the learning device is further configured to supply the calculated weighting value to the error correction encoding/decoding unit for use as a parameter for decoding data read from the memory unit.

* * * * *